United States Patent [19]

Yim et al.

[11] Patent Number: 4,983,860
[45] Date of Patent: Jan. 8, 1991

[54] DATA OUTPUT BUFFER FOR USE IN SEMICONDUCTOR DEVICE

[75] Inventors: Hyung-Kyu Yim, Seoul; Jung-Dal Choi, Kyungsan-gun; Woong-Moo Lee, Seoul, all of Rep. of Korea

[73] Assignee: SamSung Electronics Co., Ltd., Suwon Kyung Ki-Do, Rep. of Korea

[21] Appl. No.: 292,342

[22] Filed: Dec. 30, 1988

[30] Foreign Application Priority Data

Apr. 12, 1988 [KR] Rep. of Korea ............ 1988-4120[U]

[51] Int. Cl.$^5$ ...................... H03K 17/16; H03K 19/96
[52] U.S. Cl. ..................................... 307/443; 307/448; 307/451; 307/480; 307/481; 307/270
[58] Field of Search ............... 307/443, 448, 449, 451, 307/465, 480, 546, 481, 270

[56] References Cited

U.S. PATENT DOCUMENTS 4,570,091 2/1986 Yasuda et al. ...................... 307/451
4,612,466 9/1986 Stewart ................................ 307/451
4,700,086 10/1987 Ling et al. ........................... 307/443

Primary Examiner—Stanley D. Miller
Assistant Examiner—M. Wambach
Attorney, Agent, or Firm—Robert E. Bushnell

[57] ABSTRACT

A data output buffer being capable of precharging a data bus without increasing its current consumption and without having great dependency upon the process variation, whereby a READ access time of a semiconductor device is considerably reduced and the noise of source supplying voltages (Vcc, Vss) is also controlled to its least possible level in a semiconductor chip. The buffer includes means for minimizing the DC current consumption of a data bus precharge driver by feeding back an electric potential of an I/O port to an input of the precharging driver, and means for making the precharge driver operate during a specified period of time prior to providing the actual data by using an ATD pulse.

20 Claims, 4 Drawing Sheets

4,983,860

DATA OUTPUT BUFFER FOR USE IN SEMICONDUCTOR DEVICE

BACKGROUND OF THE INVENTION

The invention relates to a data output buffer for use in a semiconductor device and in particular the data output buffer for precharging a data bus prior to outputting actual data in a semiconductor device using an address transition detection (ATD) circuit.

In general, a data output buffer of a static random access memory (SRAM) provides an output in response to a READ/WRITE control signal, wherein outputs SAS,$\overline{\text{SAS}}$ of a differential amplifier stage in a sense amplifier are initially kept in an intermediate level (that is, precharge state) between logic HIGH state and logic LOW state, and then chosen into either one of the logic HIGH or LOW states when data comes out from the memory cell.

Referring to FIG. 1 illustrating a schematic circuit diagram of a prior-art data output buffer without any data precharging means, an output SAQ of a differential amplifier stage is coupled to each input of NAND gate A11 and NOR gate O11 whose other inputs are respectively coupled to an output enable signal $\overline{\text{OE}}$, an inverter I11 being connected between said other inputs of the NAND gate and the NOR gate. Thus, the output SAQ of the differential amplifier stage is delivered, in response to the output enable signal, to PMOS transistor T11 and NMOS transistor T12 through the NAND gate and the NOR gate, and inverters INV12 to INV15, thereby providing the buffered data to an I/O pad coupled to the PMOS and NMOS transistors. Said output buffer circuit without a data precharging means generally requires a long swing time in its operation, because the output voltage of the I/O pad swings with a great amplitude when it sequentially reads out the data of contrary logic state, more than at least two times, the output voltage of said I/O pad being continuously transferred into a logic LOW state from a logic HIGH state and then vice versa. Consequently, the prolonged access time and the noise in source supplying voltages such as, for example, Vcc and Vss, resulting from a transient peak current according to the swing width, lead to malfunction of the entire chip operation.

To remedy the above mentioned problem, another prior-art data output buffer has been disclosed in an article titled "A 34 ns 1 Mb CMOS SRAM using Triple Poly" of Tomohisa et al. in the page 262-263, a February 1987 issue of IEEE International Solid-State Circuits Conference (ISSCC), wherein there is shown a method concerning a data output buffer having therein a precharging circuit, as illustrated in FIG. 2.

FIG. 3 is a timing diagram showing every aspect of operations according to the circuit of FIG. 2. When an input SAQ is sequentially changed as "HIGH→½ Vcc→LOW" and then "LOW→½ Vcc→HIGH", the logic states at nodes 21, 22 are respectively changed as "HIGH→LOW" and then "LOW→HIGH" by the difference to input trip levels in inverters I21 and I22, thereby a HIGH pulse of node 25 precharging the input/output bus (I/O bus). However, the sizes of NMOS transistor T21 and PMOS transistor T22 should be comparatively large to make the precharging of data within a very short period of time. Because this large size leads to the formation of a DC current path through P-channel transistor of NAND gate A21, and also N-channel transistor of MOS transistors T21, T22 and NOR gate O22, a problem arises that the current consumption of a precharging driver itself increases. Furthermore, as the node 26 falls below the Vcc voltage level and the node 28 rises above the Vss voltage level, the data output drivers T23, T24 turn ON, thereby making another DC current path. Also, as the two inverters I21, I22 sharing a single input provide the outputs of logic HIGH and LOW, respectively, by the difference in their input trip levels, with the outputs precharging the data bus, the precharging time greatly changes in case that the input trip level of the inverters changes according to the process variation thereof. In the worst case, this results in the malfunction of the entire chip.

SUMMARY OF THE INVENTION

It is therefore an object of the present invention to provide a data output buffer being capable of precharging a data bus without increasing its current consumption and without having great dependency upon the process variation, whereby a READ access time of a semiconductor device is considerably reduced and the noise of source supplying voltages (Vcc, Vss) is also controlled to its least possible level in a semiconductor chip.

To achieve the above object, the data output buffer according to the present invention includes means for minimizing the DC current consumption of a data bus precharge driver by feeding back an electric potential of an I/O port to an input of the precharging driver, and means for making the precharge driver operate during a specified period of time prior to outputting the actual data by using an ATD pulse.

DETAILED DESCRIPTION OF THE INVENTION

A preferred embodiment of the present invention will now be described with reference to FIG. 4 and 5.

Figure 1:
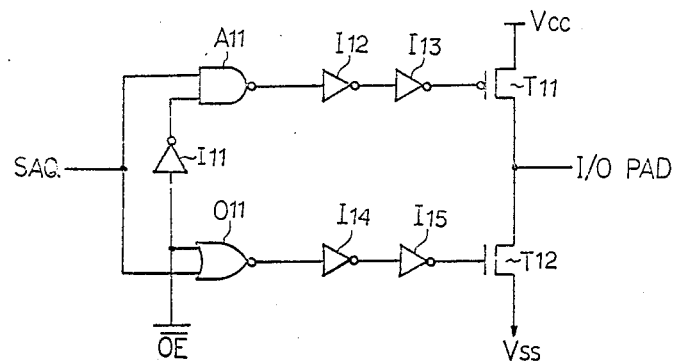
FIG. 1 is a schematic circuit diagram of a conventional data output buffer without any data bus precharge circuit.
Figure 2:
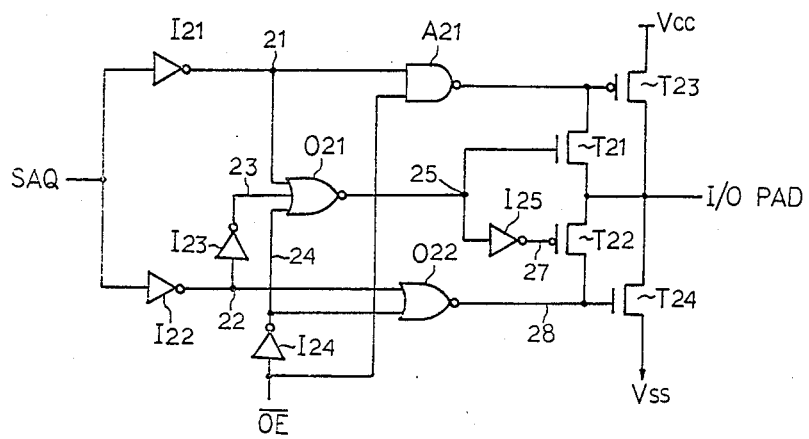
FIG. 2 is a schematic circuit diagram of another conventional data output buffer with a data bus precharge circuit therein.
Figure 3:
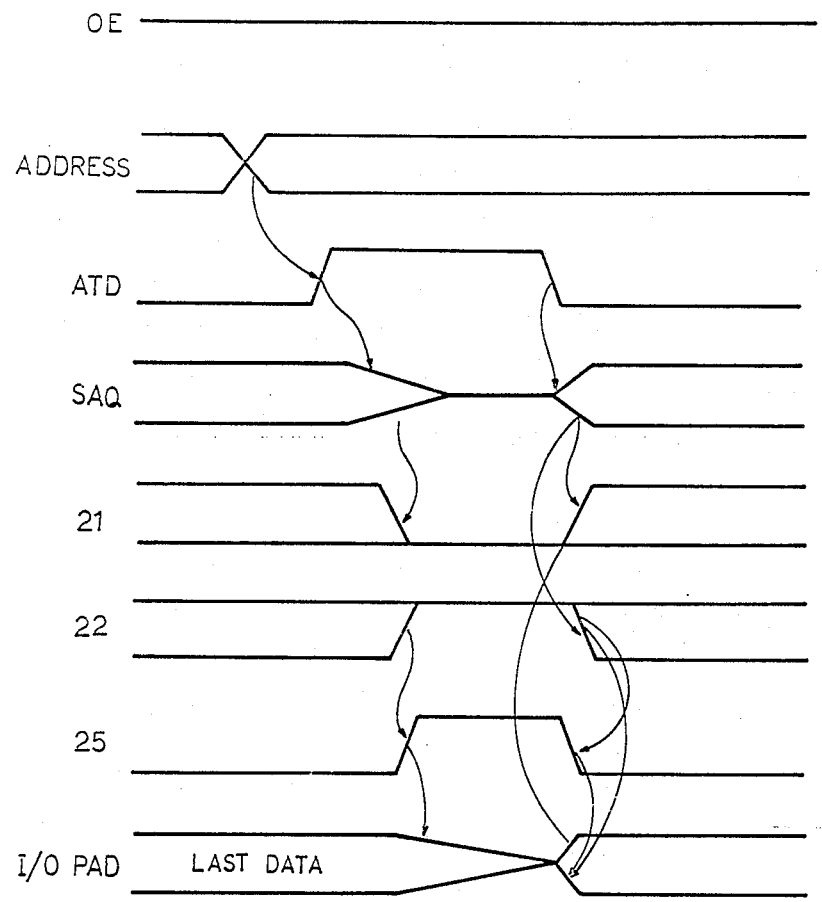
FIG. 3 is a timing diagram showing every aspect of operation in FIG. 2.
Figure 4:
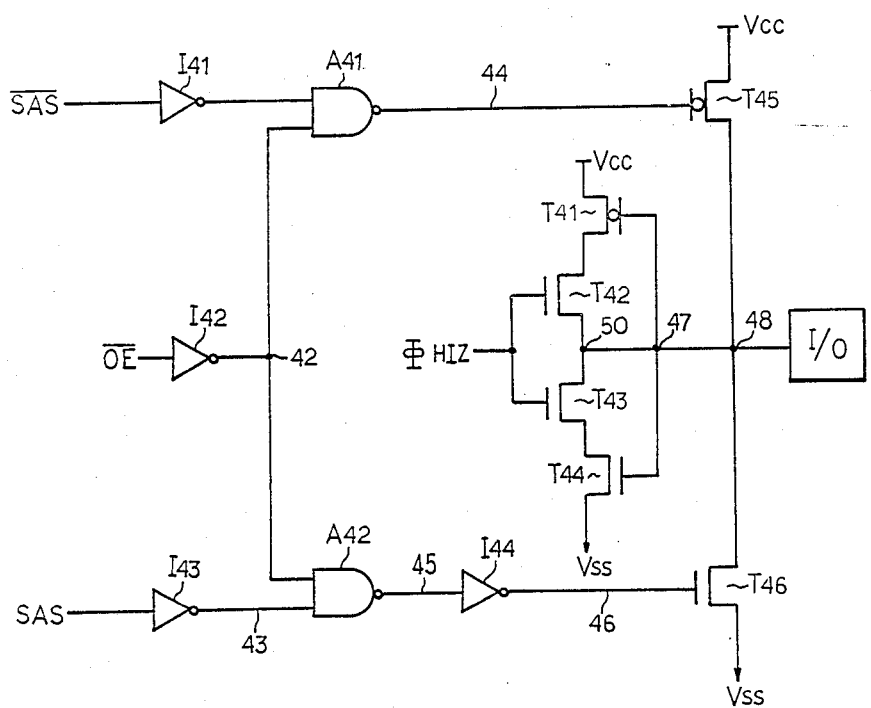
FIG. 4 is a circuit diagram of a preferred embodiment according to the present invention.

FIG. 4 is a circuit diagram showing a preferred embodiment of data output buffer according to the present invention, wherein reference numerals I41-I44 are inverters, A41 and A42 are NAND gates, T41 and T45 are PMOS transistors, and T42-T44 and T46 are NMOS transistors, respectively. A sense amplifier output $\overline{\text{SAS}}$ is coupled to an inverter I41, and another sense amplifier out SAS is coupled to an inverter I43. Each output of said inverters is coupled to NAND gates A41 and A42, respectively. A buffer output enable port $\overline{\text{OE}}$ is coupled to an inverter I42 whose output is coupled to each input of the NAND gate A41, A42. Outputs of the NAND gates are each coupled to a gate of PMOS transistor T45 and an inverter I44. A control signal ΦHIZ applied to an input node from ATD circuit (not shown) is coupled to gates of NMOS transistors T42 and T43, and a drain of the NMOS transistor T42 is coupled to a drain of NMOS transistor T41 and a source thereof is coupled to a node 58. To a source of the NMOS transistor T43 is coupled a drain of another NMOS transistor T44. At the node 58, are coupled to each other the source of NMOS transistor T42 and the drain of NMOS transistor T43, and at another node 47, are coupled to each other the gates of PMOS and NMOS transistor T41, T44. The two nodes 47 and 58 are coupled to an I/O pad, through a node 48 connected to the transistors T45, T46. The source of NMOS transistor T46 is coupled to a ground voltage level (Vss).

Figure 5:
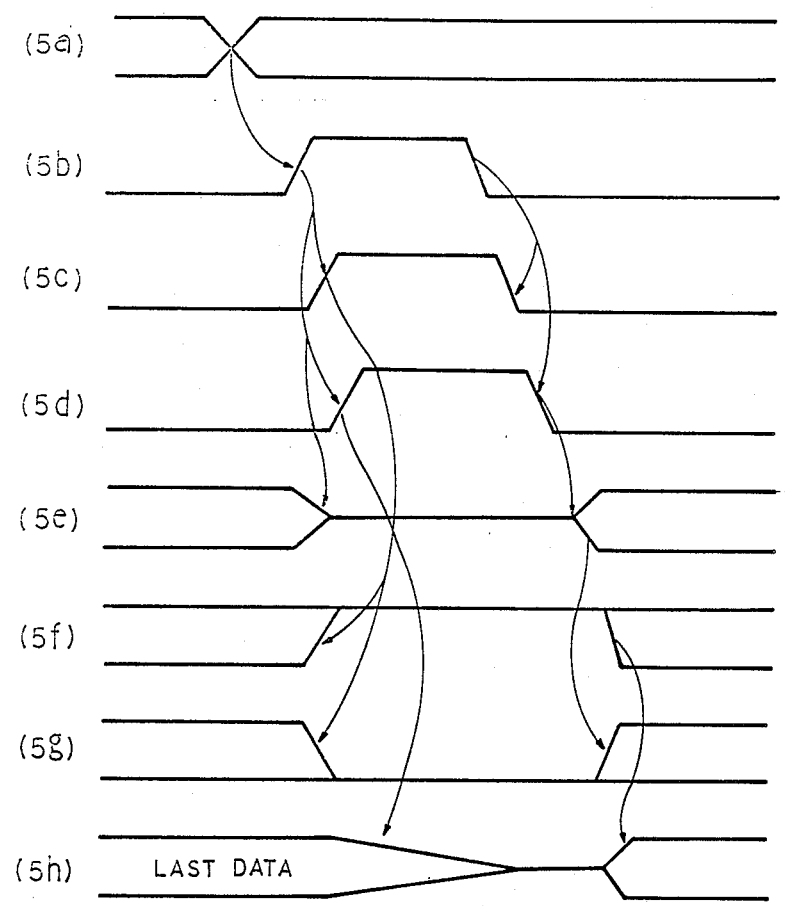
FIG. 5 is a timing diagram showing every aspect of operation in FIG. 4.

FIG. 5 shows waveforms according to every aspect of operations in the circuit of FIG. 4, wherein a waveform (5a) is an example of an address signal, a waveform (5b) a detection signal of an ATD circuit, a waveform (5c) an output enable signal $\overline{OE}$, a waveform (5d) a precharge driver control signal provided by the detection signal (5b), a waveform (5e) an output signal of sense amplifier output SAS, a waveform (5f) an output signal of the node 44, a waveform (5g) an output signal of the node 46, and a waveform (5h) an output signal of the I/O pad.

Referring to FIG. 4, there is shown the data output buffer having therein a data bus driver, wherein the inverters I41, I43, I44, the NAND gates A41, A42 and the MOS transistors T45, T46, namely, the output drivers have the same arrangement as those of the conventional data output buffer. The data bus precharge driver of the present invention includes PMOS transistor T41 and NMOS transistors T42–T44, wherein the gates of PMOS and NMOS transistors T41, T44 are coupled to the data bus of an I/O pad, thereby feeding back the electric potential of the data bus into the input of the driver, and the gates of the NMOS transistors T42, T43 are controlled by the ATD signal shown in the waveform (5d).

When the address signal (5a) actually changes its state on a READ access, the output enable signal (5c) and the driver control signal (5d) go into logic HIGH state by the ATD detection signal (5b), as shown in FIG. 5. Therefore, as the nodes 44 and 46 respectively turn into HIGH and LOW states as shown in the waveforms (5f) and (5g), the PMOS transistor T45 and the NMOS transistor T46 turn off, and then the data bus precharge drivers T42, T43 operate according to the signal (5d). At this moment, if the potential of data node 47 is HIGH, the data bus goes down into a level of ½ Vcc (a half of the source supply voltage Vcc) by discharging through the NMOS transistors T43, T44, whereas if said potential is LOW, the data bus goes up into the ½ Vcc voltage level by charging through the PMOS transistor T41 and NMOS transistor T42. Next, when the control signal (5d) goes LOW, the NMOS transistors T42, T43 of precharge driver turn OFF, thereby cutting off the operation thereof. In the meanwhile, the remaining operations in transferring the output data from the sense amplifier output SAS to the data output buffer are all the same as those of the conventional data output buffer.

As is apparent from the aforementioned description, through precharging the data bus by feeding back the electric potential of the data bus into the data bus precharge driver, there is capable of preventing the formation of DC current path, thereby reducing the power consumption in the data output buffer of the semiconductor device. Also, as it is easily controlled only by an address transition detection (ATD) pulse width, the data bus can be precharged without great dependency upon the process variation. Consequently, the aforesaid data bus precharging function can efficiently achieve a reduction of peak current in the source supply voltages Vcc and Vss, and thereby reduce the rising and falling time in the operation, for example up to 3 to 18 nsec.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A data output buffer circuit for use in a semiconductor device, for buffering data received from a sense amplifier output, said circuit comprising:
   inverting means for providing inverted signals by inverting the data received from the sense amplifier output;
   logic means for receiving the inverted signals of said inverting means and an inverted signal of an output enable signal, and therefrom generating output driving control signals;
   output driving means for supplying an output potential to an output node according to said output driving control signals; and
   precharging driver means controlled by address transition detection signals, for precharging an output data bus, said precharging driver means including:
   first and second transistors receiving at each gate thereof the address transition detection signals, a source of said first transistor and a drain of said second transistor being coupled to said output node,
   a third transistor having drain and source respectively coupled to a drain of said first transistor and a first source supplying voltage, and
   a fourth transistor having drain and source respectively coupled to a source of said second transistor and a second source supplying voltage,
   whereby the output potential from said output driving means is fed back to each gate of said third and fourth transistors, through said output node.

2. The data output buffer circuit of claim 1, wherein said first, second and fourth transistors are NMOS transistors, and said third transistor is a PMOS transistor.

3. The data output buffer circuit of claim 1, wherein said first source supplying voltage is a conventional $V_{cc}$ level of voltage, and said second source supplying voltage is a conventional $V_{ss}$ level of voltage.

4. The data output buffer circuit of claim 1, wherein said output driving means comprises:
   a fifth transistor having drain and source coupled between said first source of supplying voltage and said output node; and
   a sixth transistor having drain and source coupled between said output node and said second source supplying voltage.

5. The data output buffer circuit of claim 2, wherein said first source supplying voltage is a conventional $V_{cc}$ level of voltage, and said second source supplying voltage is a conventional $V_{ss}$ level of voltage.

6. The data output buffer circuit of claim 5, wherein said first source supplying voltage is a conventional $V_{cc}$ level of voltage, and said second source supplying voltage is a conventional $V_{ss}$ level of voltage.

7. The data output buffer circuit of claim 4, further comprised of said first, second, fourth and sixth transistors being NMOS transistors, and said third and fifth transistors being PMOS transistors.

8. The data output buffer circuit of claim 4, wherein said first source supplying voltage is a conventional $V_{cc}$ level of voltage, and said second source supplying voltage is a conventional $V_{ss}$ level of voltage.

9. The data output buffer circuit of claim 7, wherein said first source supplying voltage is a conventional $V_{cc}$ level of voltage, and said second source supplying voltage is a conventional $V_{ss}$ level of voltage.

10. A data output buffer, comprising:
   inverting means for providing inverted signals by inverting the data received from a sense amplifier output;
   logic means for receiving the inverted signals of said inverting means and an inverted signal of an output enable signal, and therefrom generating output driving control signals;
   output driving means for supplying an output potential to an output node according to said output driving control signals; and
   precharging driver means controlled by address transition detection signals, for precharging an output data bus, wherein said precharging driver means includes:
      a first transistor having a gate coupled to receive said address transition detection signals, and having a drain coupled to an output node, and
      a second transistor having a drain and source respectively coupled to a source of said first transistor and a second source supplying voltage, and a gate coupled to said output node.

11. The data output buffer circuit of claim 10, wherein said first and second transistors are NMOS transistors.

12. The data output buffer circuit of claim 10, wherein said output driving means comprises:
   a third transistor having drain and source coupled between said first source of supplying voltage and said output node; and
   a fourth transistor having drain and source coupled between said output node and said second source supplying voltage.

13. The data output buffer circuit of claim 12, wherein said first, second and fourth transistor are NMOD transistors, and said third transistor is a PMOS transistor.

14. A data output buffer, comprising:

inverting means for providing inverted signals by inverting the data received from the sense amplifier output;
   logic means for receiving the inverted signals of said inverting means and an inverted signal of an output enable signal, and therefrom generating output driving control signals;
   output driving means for supplying an output potential to an output node according to said output driving control signals; and
   precharging driver means controlled by address transition detection signals, for precharging an output data bus, wherein said precharging driver means includes:
      a first transistor having one of a drain and source coupled to a first source supplying voltage and a gate coupled to said output node; and
      a second transistor having one of a drain and source coupled to a second source supplying voltage and a gate coupled to an output node.

15. The data output buffer circuit of claim 14, wherein said output driving means comprises:
   a third transistor having drain and source coupled between aid first source of supplying voltage and said output node; and
   a fourth transistor having drain and source coupled between said output node and said second source supplying voltage.

16. The data output buffer circuit of claim 15, further comprised of said first and third transistors being PMOS transistors, and said second and fourth transistors being NMOS transistors.

17. The data output buffer circuit of claim 14, wherein said first source supplying voltage is a conventional $V_{cc}$ level of voltage, and said second source supplying voltage is a conventional $V_{ss}$ level of voltage.

18. The data output buffer circuit of claim 15, wherein said first source supplying voltage is a conventional $V_{cc}$ level of voltage, and said second source supplying voltage is a conventional $V_{ss}$ level of voltage.

19. The data output buffer circuit of claim 16, wherein said first source supplying voltage is a conventional $V_{cc}$ level of voltage, and said second source supplying voltage is a conventional $V_{ss}$ level of voltage.

20. The data output buffer of claim 14, further comprised of a third transistor having a drain and source coupled between the other of said drain and source of said first transistor and said output node, and a gate coupled to receive said detection signals.

* * * * *